US006574763B1

(12) United States Patent
Bertin et al.

(10) Patent No.: US 6,574,763 B1
(45) Date of Patent: Jun. 3, 2003

(54) METHOD AND APPARATUS FOR SEMICONDUCTOR INTEGRATED CIRCUIT TESTING AND BURN-IN

(75) Inventors: Claude L. Bertin, South Burlington, VT (US); Erik L. Hedberg, Essex Junction, VT (US); Russell J. Houghton, Essex Junction, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/473,886

(22) Filed: Dec. 28, 1999

(51) Int. Cl.$^7$ ............................................... G01R 31/28
(52) U.S. Cl. ....................................... 714/738; 324/760
(58) Field of Search ................................ 714/718, 735; 365/200; 324/760, 765

(56) References Cited

U.S. PATENT DOCUMENTS

| | | | |
|---|---|---|---|
| 5,134,616 A | 7/1992 | Barth, Jr. et al. ............ | 714/711 |
| 5,173,906 A | 12/1992 | Dreibelbis et al. ........... | 714/733 |
| 5,313,424 A | 5/1994 | Adams et al. ................ | 365/200 |
| 5,576,999 A | 11/1996 | Kim et al. .................... | 365/200 |
| 5,631,868 A | 5/1997 | Termullo, Jr. et al. ....... | 365/200 |
| 5,648,934 A | 7/1997 | O'Toole ...................... | 358/1.14 |
| 5,657,284 A | 8/1997 | Beffa .......................... | 365/201 |
| 5,706,234 A | 1/1998 | Pilch, Jr. et al. ............ | 365/201 |
| 5,751,647 A | 5/1998 | O'Toole ...................... | 365/200 |
| 5,764,574 A | 6/1998 | Nevill et al. ................. | 365/200 |
| 5,764,650 A | 6/1998 | Debenham ................... | 714/704 |
| 5,781,483 A | 7/1998 | Shore .......................... | 365/200 |
| 5,781,486 A | 7/1998 | Merritt ........................ | 365/201 |
| 5,808,351 A | 9/1998 | Nathan et al. ................ | 237/528 |
| 5,808,947 A | 9/1998 | McClure ...................... | 365/201 |
| 5,812,466 A | 9/1998 | Lee et al. ..................... | 365/200 |
| 5,835,431 A | 11/1998 | Miner et al. ................. | 365/201 |
| 5,841,709 A | 11/1998 | McClure ...................... | 365/200 |
| 5,841,712 A | 11/1998 | Wendell et al. .............. | 365/200 |
| 5,861,660 A | 1/1999 | McClure ...................... | 257/620 |
| 5,956,350 A | * 9/1999 | Irrinki et al. ................ | 714/718 |

OTHER PUBLICATIONS

IBM Technical Disclosure Bulletin, "Semiconductor Memory Redundancy at the Module Level" vol. 23 No. 8 Jan. 1981, pp. 3601–3602.
IBM Technical Disclosure Bulletin, "Efficient Use of Redundant Bit Lines for Yield Optimization", vol. 31 No. 12 May 1989, pp. 107–108.
IBM Technical Disclosure Bulletin, "Improved Computer Memory Chip", vol. 39, No. 11 Nov. 1996, p. 51–52.

* cited by examiner

*Primary Examiner*—Albert Decady
*Assistant Examiner*—Shelly A Chase
(74) *Attorney, Agent, or Firm*—DeLio & Peterson, LLC; Peter W. Peterson; Robert A. Walsh

(57) ABSTRACT

A burn-in process is provided for a memory array having redundant bits and addressable storage locations. The burn-in process includes the steps of raising the temperature of the memory array to a pre-determined temperature, testing all bits in the array, detecting faulty bits and operable bits, replacing faulty bits with redundant operable bits, correcting any defects in the array in-situ, and lowering the temperature of the memory array to ambient temperature to complete the burn-in process. An apparatus for carrying out the above process is provided that includes a test circuit for generating a test pattern and for applying the test pattern to the memory array so as to test all bits within the memory array. A comparison circuit, coupled to the test circuit and adapted to couple to the memory array, compares an actual response and an expected response of the memory array to the test pattern and detects faulty and operable bits based thereon. A failed address buffer register, coupled to the comparison circuit and to the test circuit, stores an address of each addressable storage location that has a faulty bit. Sparing control logic, coupled to the failed address buffer register and adapted to couple to the memory array, reads out each address stored by the failed address buffer register and replaces each faulty bit with a redundant operable bit.

23 Claims, 4 Drawing Sheets

METHOD AND APPARATUS FOR SEMICONDUCTOR INTEGRATED CIRCUIT TESTING AND BURN-IN

FIELD OF THE INVENTION

The present invention relates to semiconductor integrated circuits and more specifically to a method and apparatus for semiconductor integrated circuit testing and burn-in.

BACKGROUND OF THE INVENTION

To increase device yield, semiconductor integrated circuits such as DRAM and SRAM memories employ redundant circuitry that allows the integrated circuits to function despite the presence of one or more manufacturing or other defects (e.g., by employing the redundant circuitry rather than the original, defective circuitry). For example, conventional DRAM and SRAM memories often use laser fuse blow techniques as part of their redundancy scheme wherein redundant circuitry may be employed in place of defective circuitry by blowing one or more fuses with a laser beam.

While laser fuse blow techniques improve device yield, several problems remain. Laser fuse blow techniques must be performed at the wafer level and thus are time consuming and costly. For example, a wafer typically must leave a test station for fuses to be blown, and then return to the test station for verification. For DRAM memories, 80% of post burn-in module fallout yield loss can be due to single cell bit fails. However, while single cell bits fails are recoverable with redundancy, laser fuse blow techniques cannot be applied to modules.

To address the limitations of laser fuse blow techniques, electronic fuses and antifuses have been developed which may be electronically blown at the module level. For example, U.S. patent application Ser. No. 09/466,495 (titled "ANTIFUSES AND METHODS FOR FORMING THE SAME") and U.S. patent application Ser. No. 09/466,479 (titled "METHODS AND APPARATUS FOR BLOWING AND SENSING ANTIFUSES"), both incorporated by reference herein in their entirety, disclose antifuse structures and circuitry for blowing/sensing antifuses, respectively. Such antifuse structures and related circuitry are particularly useful for eliminating single cell bit fails in DRAM memories.

In order to repair integrated circuitry defects, defects must first be identified. However, conventional defect identification approaches often cannot identify certain early-life defects, such as "self-healing" defects which appear at elevated temperatures (e.g., above 120° C.) or below ambient temperatures (e.g., about 10° C.), but which do not appear at the operating temperatures typically used for blowing fuses and antifuses (e.g., about 85° C.). Accordingly, a need exists for an improved method and apparatus for semiconductor integrated circuit testing and burn-in that can identify and correct circuitry defects, including self-healing defects and other early life defects.

SUMMARY OF THE INVENTION

To overcome the needs of the prior art, an improved method and apparatus are provided for semiconductor integrated circuit testing and burn-in that can identify and correct circuitry defects, including self-healing defects and other early life defects. Specifically, an inventive method and apparatus are provided that significantly increase the capabilities of a conventional burn-in oven to detect early life defects.

In a first aspect of the invention, a burn-in process is provided for a memory array having redundant bits and addressable storage locations. The burn-process includes the steps of raising the temperature of the memory array to a pre-determined temperature, testing all bits in the array, detecting faulty bits and operable bits, replacing faulty bits with redundant operable bits, correcting any defects in the array in-situ (e.g., while within a burn-in oven), and lowering the temperature of the memory array to ambient temperature to complete the burn-in process of the memory array.

In a second aspect of the invention, an apparatus for carrying out the above process is provided. The apparatus includes a test circuit adapted to couple to a memory array and that generates a test pattern and applies the test pattern to the memory array so as to test all bits within the memory array. A comparison circuit, coupled to the test circuit and adapted to couple to the memory array, compares an actual response of the memory array to the test pattern to an expected response of the memory array to the test pattern, and detects faulty and operable bits based thereon. A failed address buffer register, coupled to the comparison circuit and to the test circuit, stores an address of each addressable storage location that has a faulty bit. Sparing control logic, coupled to the failed address buffer register and adapted to couple to the memory array, reads out each address stored by the failed address buffer register and replaces each faulty bit with a redundant operable bit.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
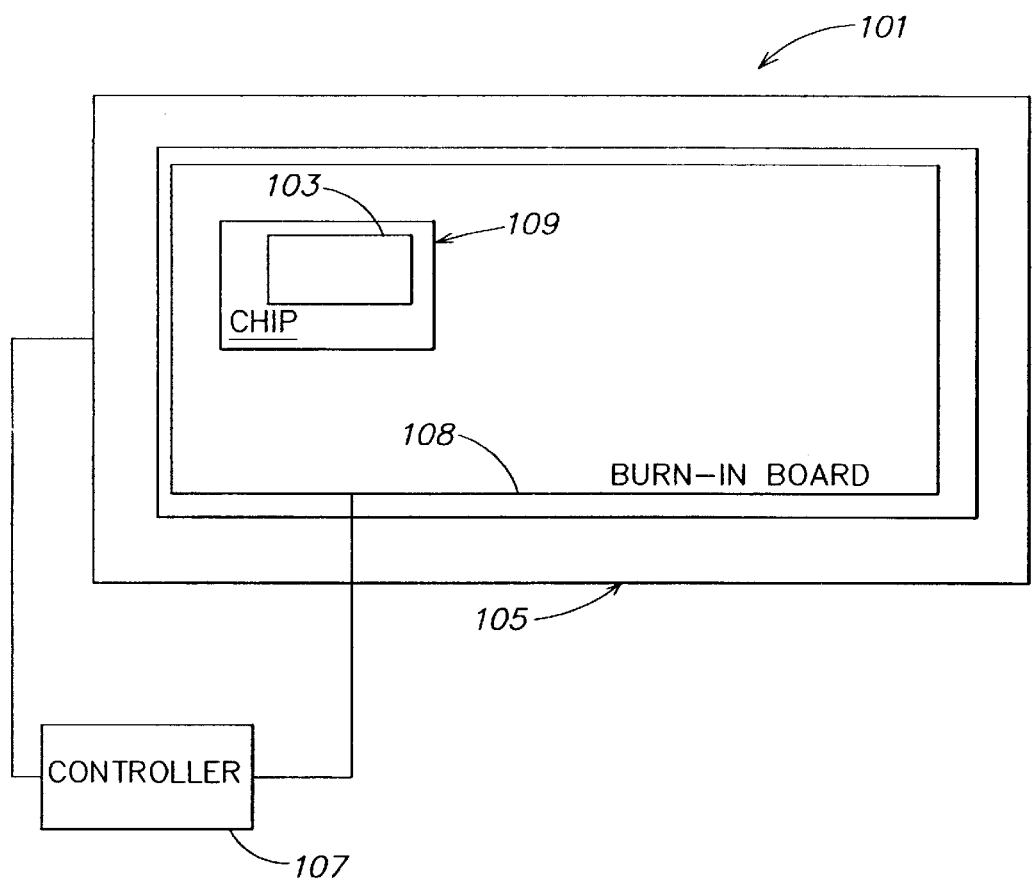
FIG. 1 is a schematic diagram of an inventive burn-in and test system for burning-in and testing a semiconductor device.

FIG. 1 is a schematic diagram of an inventive burn-in and test system 101 for burning-in and testing a semiconductor device, such as a semiconductor memory array 103. The burn-in and test system 101 comprises a conventional burn-in oven 105, such as a Model No. RI2K burn-in oven manufactured by Reliability, Inc., coupled to a controller 107, a burn-in board 108 located within the burn-in oven (or chamber) 105 and coupled to the controller 107 and a testing and repair apparatus 109 coupled to the burn-in board 108.

The controller 107 may comprise any conventional controller such as a microprocessor, a microcontroller, a computer system or the like having program code stored therein for controlling the operation of the burn-in and test system 101 as described below.

The testing and repair apparatus 109 comprises a number of components adapted to test the operability of each bit for memory array 103, to detect faulty bits and operable bits, and to replace faulty bits with redundant operable bits (provided within the memory array 103), preferably correcting any defects in the memory array 103 while the memory array 103 remains within the burn-in oven 105. Preferably the testing and repair apparatus 109 is formed on a single semiconductor substrate. The preferred embodiment of the testing and repair apparatus 109 is described below with reference to FIG. 4.

Figure 2:
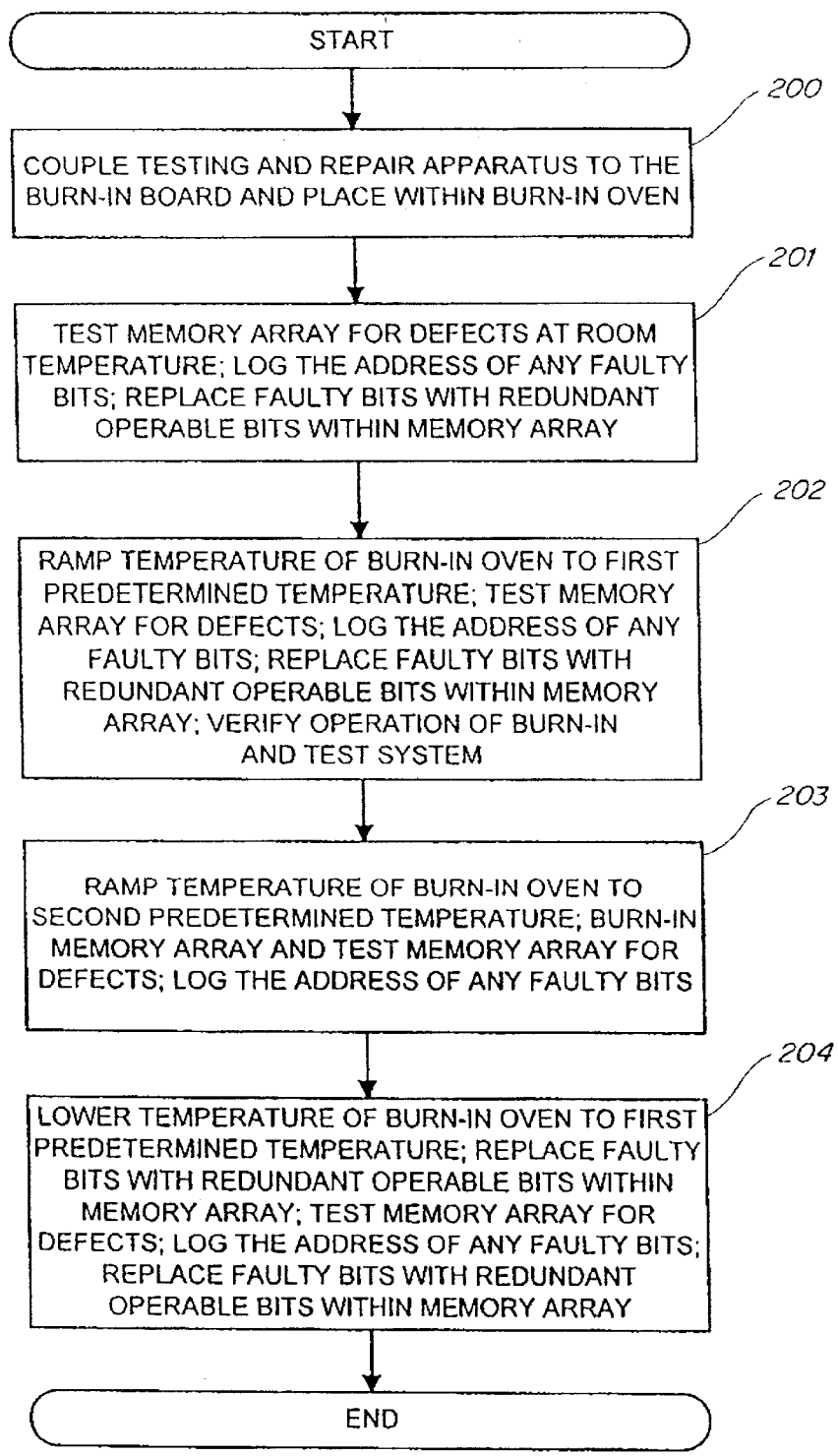
FIG. 2 is a flowchart of the preferred operation of the burn-in and test system of FIG. 1.

FIG. 2 is a flowchart of the preferred operation of the burn-in and test system 101 during burn-in and testing, wherein early-life defects within the memory array 103 are identified and corrected in-situ. Unlike conventional testing systems, the burn-in and test system 101 can identify and correct self-healing defects that appear at elevated testing temperatures but that do not appear subsequently at the operating temperatures typically employed to blow fuses and antifuses.

With reference to FIG. 2, in step 200 a user of the burn-in and test system 101 couples the testing and repair apparatus 109 to the burn-in board 108 and places the burn-in board 108 within the burn-in oven 105. As described with reference to FIG. 4, the testing and repair apparatus 109 preferably is formed on the same semiconductor chip as the memory array 103, and may have one or more components formed within the memory array 103 or may be formed from components separate from the memory array 103. With the burn-in board 108 loaded into the burn-in oven 105, testing of the memory array 103 commences.

Figure 3A:
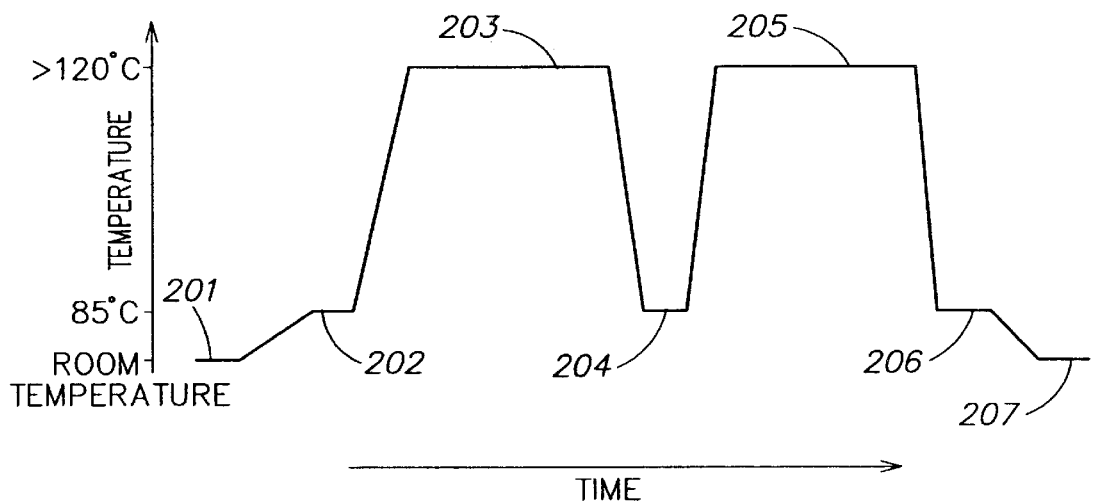
FIG. 3A is a timing diagram of a preferred temperature profile for the burn-in and test system of FIG. 1.

FIG. 3A is a timing diagram of a preferred temperature profile for the burn-in oven 105 during burn-in and testing of the memory array 103, and is described with the flowchart of FIG. 2. With reference to FIGS. 2 and 3A, in step 201, an initial test is performed on the memory array 103 while the memory array 103 is at room temperature. For example, a voltage may be written to each bit within the memory array 103 and then read out to verify that the array is functioning properly. Typically this initial test lasts about one minute. However, the addresses of any bits that fail during testing are logged by the testing and repair apparatus 109 and faulty bits are replaced with redundant operable bits within the memory array 103 (as described below).

In step 202, the temperature of the burn-in oven 105 is raised to a first predetermined temperature (about 85° C.), and the memory array 103 is again tested. Because it is unlikely that many single bit fails will occur at this temperature, testing is performed for a relatively short period (e.g., about 10–15 minutes). More importantly, during step 202, the proper operation of the burn-in and test system 101 is verified (e.g., whether the memory array 103 is properly mounted within a burn-in socket, whether the burn-in oven 105 is operating properly, etc.) prior to high voltage-high temperature stressing. However, the addresses of any bits that fail during testing are logged by the testing and repair apparatus 109 and faulty bits are replaced with redundant operable bits within the memory array 103 (as described below).

In step 203, the temperature of the burn-in oven 105 is raised to a second pre-determined temperature (e.g., preferably above about 120° C., most preferably between about 130–150° C.) and the "burn-in" cycle of the memory array 103 begins. The memory array 103 preferably is burned-in by employing high temperature-high voltage stressing for a predetermined time period (e.g., about 4–5 hours). For example, a memory array having a 2.5 volt operating voltage may be burned-in by heating the array to a temperature of above about 120° C. while the array is subjected to a voltage of about 5 volts. This form of stressing accelerates the aging of the memory array so as to identify early life defects within the array (e.g., allowing such defects to be corrected using redundancy schemes).

During burn-in of the memory array 103 (step 203), the memory array 103 is periodically or continuously tested to identify any defects within the array. For example, a voltage may be written to each addressable bit within the memory array 103 and subsequently read out of the array to verify that what was written to an address of the array is what was read out from the address. Any discrepancy therebetween indicates that the bit/bits corresponding to the tested address is/are faulty. The address of each faulty bit is logged by the testing and repair apparatus 109.

Following burn-in of the memory array 103, in step 204 the temperature of the burn-in oven 105 is lowered to the first pre-determined temperature (e.g., about 85 ° C.) and the bits identified as faulty by each address logged by the testing and repair apparatus 109 are replaced through appropriate application of redundancy circuitry within the memory array 103 (described below). Specifically, the testing and repair apparatus 109 examines each logged failed address and selects a redundant operable bit or redundant operable bits within the memory array 103 to replace the faulty bit or bits identified during high temperature burnin (e.g., by employing sparing control logic to blow fuses or antifuses within the memory array 103 as described below with reference to FIG. 4).

As stated previously, certain early life defects that appeared during burn-in at the second predetermined temperature (e.g., the burn-in temperature, typically above about 120 ° C.) may be "self healing" defects or fails unique to that high temperature stress which do not appear at the subsequent lower temperature employed during step 204 (e.g., about 85° C.). However, because the testing and repair apparatus 109 logs the addresses of bits that are faulty while at the second pre-determined temperature, such self-healing defects or fails unique to that high temperature stress are nonetheless correctable via the testing and repair apparatus 109. Following faulty bit replacement, the memory array 103 is again tested for faulty bits while at the first predetermined temperature and the bits identified as faulty by each address logged by the testing and repair apparatus 109 are replaced through appropriate application of redundancy circuitry within the memory array 103.

Figure 3B:
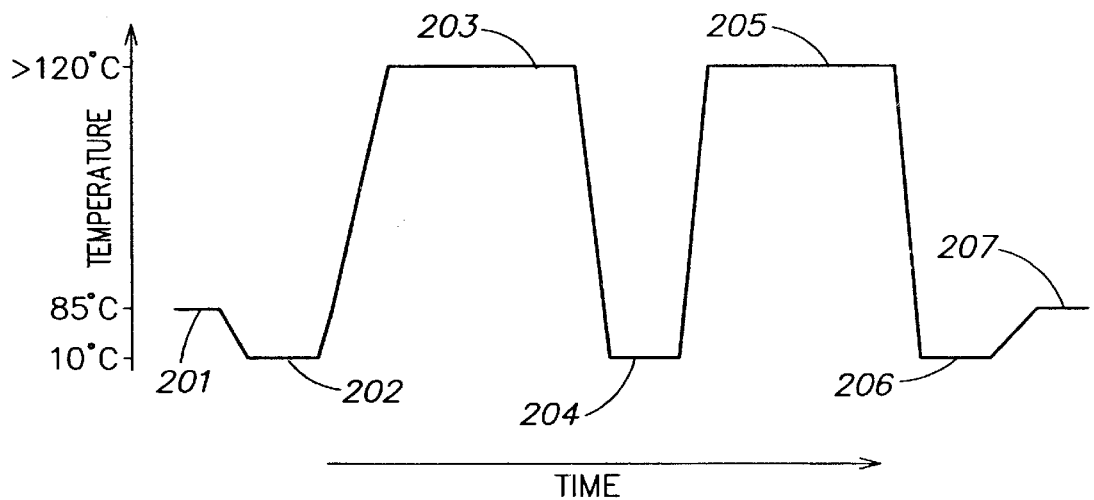
FIG. 3B is a timing diagram of an alternative temperature profile that is employable for the burn-in and test system of FIG. 1.

Following replacement of the faulty array bits in step 204, the testing/burn-in of the memory array 103 may end as shown in FIG. 2 (e.g., by lowering the temperature of the burn-in oven 105 to room temperature and by then removing the memory array 103 from the burn-in and test system 101). Alternatively, the above process may be repeated as shown in FIG. 3A by steps 205 and 206 (prior to lowering the burn-in oven 105 to room temperature and removing the memory array 103 therefrom). It will be understood that faulty bits may be replaced during any step, if desired. However, blowing fuses and/or antifuses via onchip voltage generator circuitry (as described below) is difficult at temperatures above about 120° C. (e.g., during steps 203 or 205). Further, other temperature profiles may be employed during device burn-in and testing. For example, FIG. 3B is a timing diagram of an alternative temperature profile that is employable during the burn-in and testing of the memory array 103. For the temperature profile of FIG. 3B testing (during step 201) and faulty bit replacement are performed at about 85° C., testing and verification of proper operation of the burn-in and test system 101 (during step 202) are performed at about 10° C., and testing and replacement of faulty bits (during step 204) are performed at about 10° C. This process may be repeated in steps 205–207 if desired.

Figure 4:
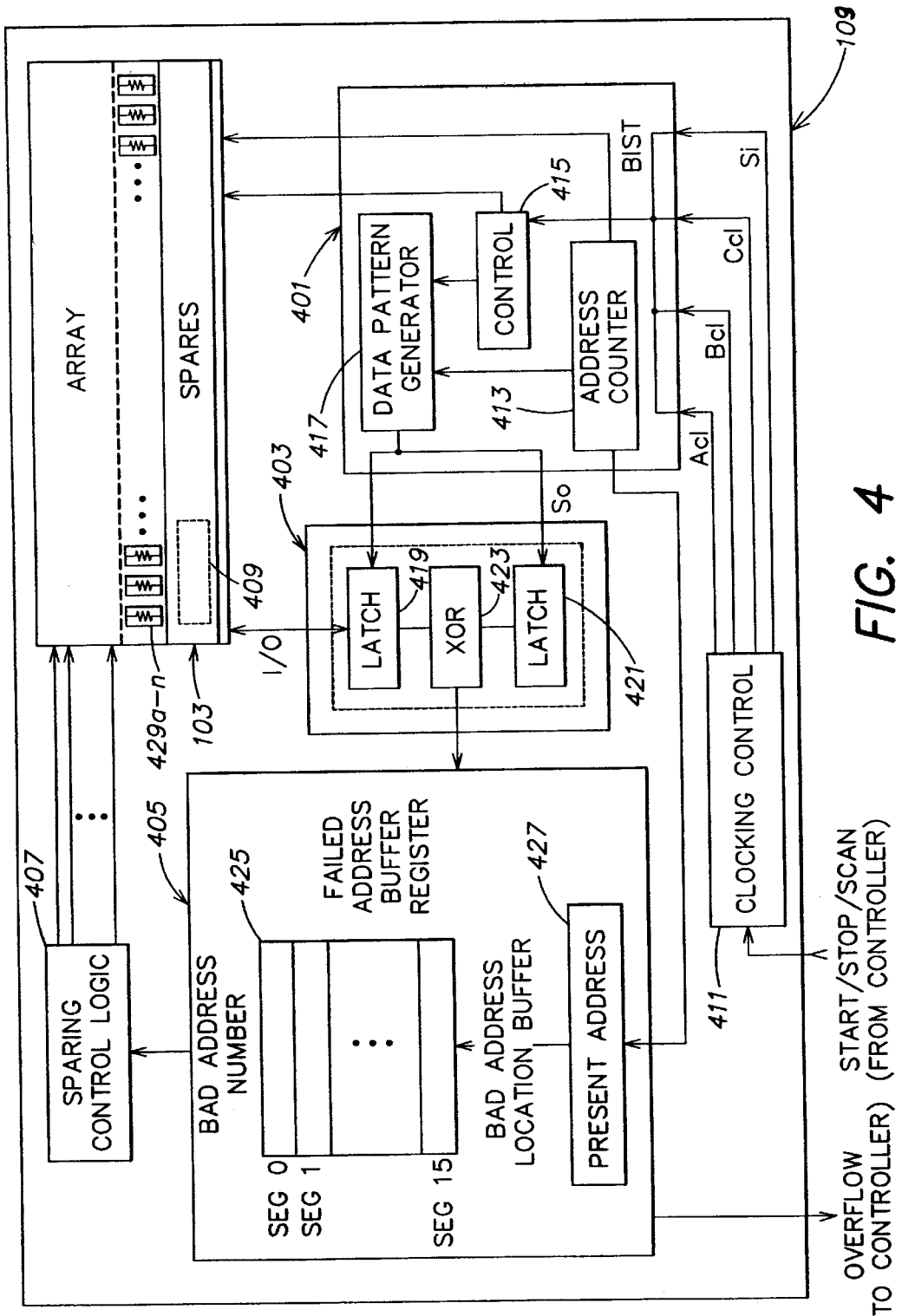
FIG. 4 is a schematic diagram of the preferred configuration of a testing apparatus of the burn-in and test system of FIG. 1.

FIG. 4 is a schematic diagram of the preferred configuration of the testing and repair apparatus 109 of FIG. 1. In the preferred configuration of FIG. 4, the testing and repair apparatus 109 is formed on the same semiconductor chip as the memory array 103. However, the testing and repair apparatus 109 may be formed separate from the memory array 103 (e.g., on its own semiconductor chip or via discrete components), and portions of the testing and repair apparatus 109 such as sparing control logic may be formed within the memory array 103.

With reference to FIG. 4, the testing and repair apparatus 109 includes a test control circuit 401 coupled to the memory array 103, a data comparison circuit 403 coupled to the test control circuit 401 and to the memory array 103, a failed address buffer register 405 coupled to the data comparison circuit 403 and to the test control circuit 401, and sparing control logic 407 coupled to the memory array 103 and to the failed address buffer register 405. The sparing control logic 407 may be located within the memory array 103 if desired as shown in phantom by reference numeral 409. A clocking control circuit 411 also is coupled to the test control circuit 401 and controls the operation thereof as described below.

The test control circuit 401 preferably comprises a built-in-self-test (BIST) circuit having an address counter 413 and control logic 415 each coupled to a data pattern generator 417 and to the memory array 103 (such as one of the BIST engines described in U.S. Pat. No. 5,173,906 by J. Dreibelbis et al, issued Dec. 22, 1992, entitled, "Built-In Self Test for Integrated Circuits" which is hereby incorporated by reference in its entirety). The control logic 415 also couples the clocking control circuit 411. In general, the test control circuit 401 operates by generating a data pattern via the data pattern generator 417 and by applying the data pattern to the memory array 103 via the data comparison circuit 403 so as to test all bits within the memory array 103. More specifically, the clocking control circuit 411 receives a start command from the controller 107 (FIG. 1) and in response thereto the clocking control circuit 411 supplies the appropriate clocking to the control logic 415 so as to commence data generation via the data pattern generator 417 (and testing of the memory array 103) and operational commands to the memory array 103.

During testing, the control logic 415 supplies to the memory array 103 a write command, the address counter 413 supplies to the memory array 103 an address within the memory array 103 to which test data is to be written, and the data pattern generator 417 supplies to the memory array 103 (via the data comparison circuit 403) the test data to be written into the address supplied by the address counter 413. For example, the address counter 413 may sequentially step through each address within the memory array 103 while the data pattern generator 417 writes a bit pattern to the memory location identified by each address (i.e., each address location). Preferably the data pattern generator 417 writes alternating bit values to each bit of an address location, to ensure cell to cell integrity. However, other test patterns may be employed. Thereafter, either immediately after writing test data to an address location within the memory array 103, after writing test data to a plurality of the address locations within the memory array 103 or after writing test data to all of the address locations within the memory array 103, the test data written to each address location is sequentially read out (via a read command supplied from the control logic 415 and addresses supplied from the address counter 413); and a comparison is performed between the memory array 103's actual response to the test data written thereto and the expected response of the memory array 103 as supplied by the data pattern generator 417.

The data comparison circuit 403 preferably comprises a first latch 419 for receiving data output from the memory array 103 in response to a read command from the control logic 415, a second latch 421 for receiving test data from the data pattern generator 417 (i.e., "expect" data), and an XOR gate 423 for comparing the test data read from the memory array 103 to expect data of data pattern generator 417. Specifically, for each address location within the memory array 103, the XOR gate 423 compares the expected response of the memory array 103 (e.g., the expect data written to the address location) to the actual response of the memory array 103 (e.g., the test data actually stored at the address location in response to the test data). The results of each comparison are output to the failed address buffer register 405.

The failed address buffer register 405 comprises a plurality of storage locations 425 that store the address of each memory array location having faulty bits, as identified by the data comparison circuit 403. For example, during a comparison operation between test data written to and read from an address location of the memory array 103, a register 427 within the failed address buffer register 405 stores the address of the location begin tested/compared (e.g., as supplied via the address counter 413). If the data comparison circuit 403 indicates that the data written to the address location differs from the expect data of that address location, the address location must contain at least one faulty bit. The data comparison circuit 403 therefore generates an error signal that causes one of the storage locations 425 to store or "log" the address stored in the register 427 (e.g., the address of the present address location that is being tested). To prevent multiple storing of the same address registering a fault, all previously stored failed addresses are compared to the present address stored within the register 427 and if an address match between register 427 and a storage location 425 occurs, the failing address is not stored again. This process is repeated for each address location within the memory array 103 and allows self healing defects to be logged during an elevated temperature burn-in (e.g., above about 120° C.) and subsequently corrected at a lower temperature (e.g., about 85° C.) via redundancy circuitry as described below. Note that the failed address buffer register 405 may generate an overflow signal if the number of defects (e.g., faulty bits) detected within the memory array 103 exceeds a predetermined threshold (e.g., the number of spare bits available within the memory array 103). In this manner, the controller 107 may be automatically notified that a memory array cannot be repaired via redundancy schemes and should be discarded without further testing.

Following testing of the memory array 103 and logging of the addresses of memory locations with faulty bits by the failed address buffer register 405, the addresses of memory locations with faulty bits are supplied to the sparing control logic 407 (e.g., by placing the testing and repair apparatus 109 in a repair mode via a command from the controller 107). The sparing control logic 407 preferably comprises a plurality of circuits (e.g., fuse steering latches and high voltage generators for fuse activation) for electrically activating redundancy circuitry within the memory array 103 (e.g., for electrically activating redundancy circuitry such as electronic fuses and/or antifuses 429a–n). For example, the sparing control logic 407 may comprise an on-chip high voltage generator (such as one of the generators described in U.S. patent application Ser. No. 09/466,479, filed Dec. 17,1999 which is hereby incorporated by reference herein in its entirety) for generating on-chip the voltages required to blow fuses or antifuses, fuse/antifuse selection circuitry (also described in U.S. patent application Ser. No. 09/466, 479, filed Dec. 17,1999, and the like. Suitable antifuses for use within the memory array 103 are described in U.S. patent application Ser. No. 09/466,495, filed Dec. 17,1999 which is hereby incorporated by reference herein.

Accordingly, the testing and repair apparatus 109 operates as follows. The controller 107 (FIG. 1) issues a start command to the clocking control circuit 411 such that scan-in logic initialization will occur by driving non-overlapping clocks A and B via the clocking control 411. The clocking control circuit 411 issues a "scan" command from the controller 107 so as to scan data through the circuits 401–407 (to preset the circuits 401–407) prior to beginning testing of the memory array 103. Thereafter, the testing and repair apparatus 109 writes test data patterns to each address location within the memory array 103 so that each bit within the memory array 103 is tested by a series of test patterns.

The data comparison circuit 403 compares the actual response of each bit within the memory array 103 to the applied test pattern and the expected response of the memory array 103 to the applied test pattern, and detects faulty and operable bits based thereon. In response thereto, the failed address buffer register 405 stores the address of each address location having at least one faulty bit. After the testing is complete (e.g., after a stop command is issued by the controller 107), a repair mode is invoked and the sparing control logic 407 receives each address stored by the failed address buffer register 405 and decodes each failed address to a binary stream which correlates to a fuse string required to activate redundant element address steering (e.g., which fuses/antifuses must be blown/unblown to activate the appropriate address redundancy for redundancy replacement). The sparing control logic 407 also energizes the high voltage generators required to activate the appropriate fuse strings and/or antifuse strings and thereby enable the redundant elements to replace the failed bit in the memory array 103. In this manner, array defects may be logged during elevated temperature testing/burn-in processes (having temperatures above which on-chip high voltage generators used for blowing fuses/antifuses cannot be employed due to excessive current leakage) and subsequently corrected at lower temperatures, or even after removal from the burn-in oven 105.

The foregoing description discloses only the preferred embodiments of the invention, modifications of the above disclosed apparatus and method which fall within the scope of the invention will be readily apparent to those of ordinary skill in the art. For instance, while the various components described herein (e.g., test control circuit 401, data comparison circuit 403, etc.) are preferred, other components may be similarly employed.

Accordingly, while the present invention has been disclosed in connection with the preferred embodiments thereof, it should be understood that other embodiments may fall within the spirit and scope of the invention, as defined by the following claims.

The invention claimed is:

1. A burn-in process for a memory array having redundant bits and addressable storage locations, each addressable storage location for storing at least one bit, the burn-in process comprising the steps of:
   raising the temperature of the memory array to a pre-determined temperature above 85° C. and maintaining the memory array at said predetermined temperature during subsequent testing;
   testing all bits in the array;
   detecting faulty bits and operable bits;
   replacing faulty bits with redundant operable bits;
   correcting any defects in the array in-situ; and
   lowering the temperature of the memory array to ambient temperature to complete the burn-in process of the memory array.

2. The burn-in process of claim 1 wherein testing all bits in the array comprises:
   generating a test pattern;
   writing at least one bit of the test pattern to each addressable storage location of the memory array;
   reading each bit written to each addressable storage location; and
   comparing each bit read from each addressable storage location to each bit written to each address storage location.

3. The process of claim 2 wherein detecting faulty bits comprises identifying each bit wherein the bit read from an addressable storage location is different from the bit written to the addressable storage location; and
   wherein detecting operable bits comprises identifying each bit wherein the bit read from an addressable storage location is the same as the bit written to the addressable storage location.

4. The process of claim 1 further comprising storing an address of each addressable storage location having a faulty bit.

5. The process of claim 4 further comprising generating an overflow signal if the number of stored addresses exceeds a pre-determined number.

6. A burn-in process for a memory array having redundant bits and addressable storage locations, each addressable storage location for storing at least one bit, the burn-in process comprising the steps of:
   raising the temperature of the memory array to a pre-determined temperature;
   testing all bits in the array;
   detecting faulty bits and operable bits;
   replacing faulty bits with redundant operable bits by programming at least one electronically programmable element;
   correcting any defects in the array in-situ; and
   lowering the temperature of the memory array to ambient temperature to complete the burn-in process of the memory array.

7. The process of claim 6 wherein the at least one electronically programmable element comprises at least one electronically programmable element selected from the group consisting of a fuse and an antifuse.

8. The process of claim 7 wherein raising the temperature of the memory array to a pre-determined temperature comprises raising the temperature of the memory array to a temperature equal to at least a temperature at which the electronically programmable elements are no longer programmable by an on-chip high voltage source.

9. A burn-in process for a memory array having redundant bits and addressable storage locations, each addressable storage location for storing at least one bit, the burn-in process comprising the steps of:
- raising the temperature of the memory array to a temperature above about 120° C.;
- testing all bits in the array;
- detecting faulty bits and operable bits;
- replacing faulty bits with redundant operable bits;
- correcting any defects in the array in-situ; and
- lowering the temperature of the memory array to ambient temperature to complete the burn-in process of the memory array.

10. A burn-in process for a memory array having redundant bits and addressable storage locations, each addressable storage location for storing at least one bit, the burn-in process comprising the steps of:
- raising the temperature of the memory array to a first pre-determined temperature;
- testing all bits in the array;
- detecting faulty bits and operable bits;
- storing an address of each addressable storage location having a faulty bit while the memory array is at the first pre-determined temperature;
- lowering the temperature of the memory array to a second pre-determined temperature;
- thereafter replacing faulty bits with redundant operable bits;
- correcting any defects in the array in-situ; and
- lowering the temperature of the memory array to ambient temperature to complete the burn-in process of the memory array.

11. The process of claim 10 further comprising: following replacing faulty bits with redundant operable bits, raising the temperature of the memory array to the first pre-determined temperature;
- detecting faulty bits and operable bits; storing an address of each addressable storage location having a faulty bit while the memory array is at the first pre-determined temperature;
- lowering the temperature of the memory array to the second pre-determined value; and
- replacing faulty bits with redundant operable bits.

12. An apparatus for use within a burn-in oven during a burn-in process for a memory array having redundant bits and addressable storage locations, each addressable storage location storing at least one bit, the apparatus comprising:
- a test circuit for coupling to the memory array, the test circuit, when coupled to the memory array, generating a test pattern and applying the test pattern to the memory array so as to test all bits within the memory array;
- a comparison circuit coupled to the test circuit and for coupling to the memory array, the comparison circuit, when coupled to the memory array, comparing an actual response of the memory array to the test pattern to an expected response of the memory array to the test pattern and detecting faulty and operable bits based thereon;
- a failed address buffer register coupled to the comparison circuit and to the test circuit for storing an address of each addressable storage location that has a faulty bit; and
- sparing control logic coupled to the failed address buffer register and for coupling to the memory array, the sparing control logic, when coupled to the memory array, reading out each address stored by the failed address buffer register and replacing each faulty bit with a redundant operable bit.

13. The apparatus of claim 12 wherein the test circuit comprises a built-in-self-test circuit.

14. The apparatus of claim 12 further comprising a clocking control circuit coupled to the test circuit, the clocking control circuit presetting the test circuit, initiating testing of the memory array by the test circuit or stopping testing of the memory array by the test circuit based on a pre-determined command.

15. The apparatus of claim 12 wherein the test circuit writes at least one bit of the test pattern into each addressable storage location of the memory array and subsequently reads each addressable storage location so that the memory array outputs to the comparator circuit each bit stored by each addressable storage location.

16. The apparatus of claim 15 wherein the comparator circuit compares each bit written to an addressable storage location of the memory array to each bit read from the addressable storage location of the memory array.

17. The apparatus of claim 12 wherein the failed address buffer register further comprises an overflow output which generates an overflow signal if the failed address buffer register is full.

18. The apparatus of claim 12 wherein the sparing control logic is formed within the memory array.

19. The apparatus of claim 12 wherein the test circuit, the comparison circuit, the failed address buffer register, the sparing control logic and the memory array are formed on the same semiconductor chip.

20. The apparatus of claim 12 wherein the sparing control logic comprises a plurality of electronically programmable elements, each electronically programmable element identifying an address location of a bit that is inoperable and an address location of a redundant operable bit that replaces the inoperable bit.

21. A system for testing memory arrays comprising:
- the burn-in oven of claim 12;
- the apparatus of claim 12; and
- a controller coupled to the burn-in oven and the apparatus of claim 12 and programmed to control the operation thereof.

22. The system of claim 21 wherein the controller is further programmed to perform a burn-in process that comprises:
- raising the temperature of the memory array to a first pre-determined temperature via the burn-in oven;
- testing all bits in the array via the test circuit;
- detecting faulty bits and operable bits via the comparison circuit;
- lowering the temperature of the memory array to a second pre-determined temperature via the burn-in oven; and
- replacing faulty bits with redundant operable bits via the failed address buffer register and the sparing control logic.

23. An apparatus for use within a burn-in oven during a burn-in process for a memory array having redundant bits and addressable storage locations, each addressable storage location for storing at least one bit, the apparatus comprising:

testing means for coupling to the memory array, the testing means, when coupled to the memory array, generating a test pattern and applying the test pattern to the memory array so as to test all bits within the memory array;

comparison means coupled to the test circuit and for coupling to the memory array, the comparison means, when coupled to the memory array comparing an actual response of the memory array to the test pattern to an expected response of the memory array to the test pattern and detecting faulty and operable bits based thereon;

failed address buffer means coupled to the comparison means and the testing means for storing an address of each addressable storage location that has a faulty bit;

sparing control logic means coupled to the failed address buffer means and for coupling to the memory array, the sparing control logic means reading out each address stored by the failed address buffer means and replacing each faulty bit with a redundant operable bit; and control means coupled to the testing means for controlling the operation thereof.

* * * * *